United States Patent [19]

Schroeder et al.

[11] Patent Number: 5,742,100
[45] Date of Patent: Apr. 21, 1998

[54] STRUCTURE HAVING FLIP-CHIP CONNECTED SUBSTRATES

[75] Inventors: Jack A. Schroeder; Conrad S. Monroe, both of Scottsdale, Ariz.

[73] Assignee: Motorola, Inc., Schaumburg, Ill.

[21] Appl. No.: 411,355

[22] Filed: Mar. 27, 1995

[51] Int. Cl.⁶ .................... H01L 23/48; H01L 23/52
[52] U.S. Cl. .................... 257/778; 257/737; 257/774; 257/780
[58] Field of Search .................... 257/737, 777, 257/778, 774, 780

[56] References Cited

U.S. PATENT DOCUMENTS

| | | | |
|---|---|---|---|
| 4,807,021 | 2/1989 | Okumura | 257/777 |
| 5,189,507 | 2/1993 | Carlomagno et al. | 257/777 |
| 5,237,130 | 8/1993 | Kulesza et al. | 257/778 |
| 5,299,730 | 4/1994 | Pasch et al. | 228/180.2 |
| 5,347,162 | 9/1994 | Pasch | 257/773 |
| 5,363,277 | 11/1994 | Tanaka | 257/779 |
| 5,378,869 | 1/1995 | Marrs et al. | 257/758 |

FOREIGN PATENT DOCUMENTS

| | | | |
|---|---|---|---|
| 186818 | 7/1986 | European Pat. Off. | 257/778 |
| 9111833 | 8/1991 | WIPO . | |

OTHER PUBLICATIONS

Yoshihiro Bessho et al.; IEEE; A Stud–Bump–Bonding Technique for High Density Multi–Chip–Module; Jun. 9–11, 1993 Japan IEMT Symposium; pp. 362–365.

Howard W. Markstein; "Multichip Modules Pursue Wafer Scale Performance"; Oct. 1, 1991; Electronic Packaging and Production; vol. 31, No. 10; pp. 40–45.

*Primary Examiner*—Mahshid D. Saadat
*Assistant Examiner*—T. M. Arroyo
*Attorney, Agent, or Firm*—George C. Chen

[57] ABSTRACT

A flip-chip structure and method connects a semiconductor chip (11) having conductive bumps (16) to a substrate (12) having vias (19) extending from a first side (21) to a second side (18) of the substrate (12). A filler material (22) is deposited into the vias (19), and the conductive bumps (16) are inserted into the vias (19) for connecting the semiconductor chip (11) to a conductive element (17) covering the vias (19) on the second side (18) of the substrate (12).

13 Claims, 1 Drawing Sheet

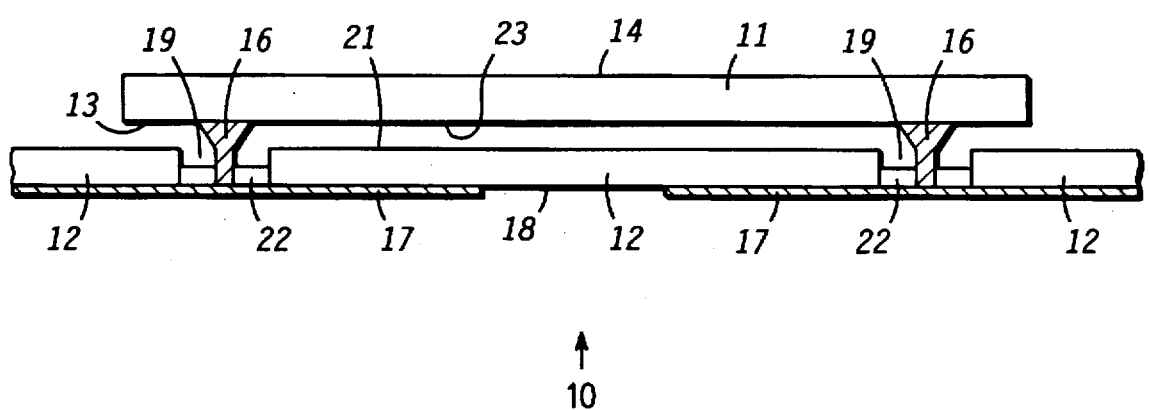

STRUCTURE HAVING FLIP-CHIP CONNECTED SUBSTRATES

BACKGROUND OF THE INVENTION

This invention relates, in general, to semiconductor device assembly, and more particularly, to a structure and method of connecting substrates.

Flip-chip technology eliminates slower, larger, less reliable, and more expensive wire bonded semiconductor packaging. During flip-chip thermal compression, eutectic bonding, or reflow for connecting a chip to a substrate, a chip is mechanically held such that conductive bumps on the chip are aligned with appropriate conductive bumps on a substrate. However, chip misalignment often occurs due to thermal expansion coefficient mismatches for the chip, chip passivation, conductive bumps, and substrate. Elevated temperatures during thermal compression, eutectic bonding, and reflow also create a liquid flux which inadvertently short together neighboring conductive bumps.

Using a lower temperature conductive polymer for the conductive bumps alleviates, but does not resolve, the flip-chip assembly problem. Using a conductive epoxy on the interconnect pads eliminates the need for thermal compression, but since the conductive epoxy is deposited on the planar interconnect pad and is not physically contained, the epoxy can leak off the interconnect pad to short together neighboring conductive bumps. Using a pre-formed planar structure or an interposer between the chip and the substrate can contain the conductive epoxy or other interconnect material, but the interposer increases the size of the packaged device.

Accordingly, a need exists for developing an improved structure for and method of connecting substrates which is reliable, fast, inexpensive, and compact.

BRIEF DESCRIPTION OF THE DRAWING

The single FIGURE is a cross-sectional view illustrating a semiconductor chip connected to a substrate.

DETAILED DESCRIPTION OF THE DRAWING

Flip-chip structure 10 with chip 11 connected to substrate 12 is depicted in cross sectional view. In the preferred embodiment, flip-chip structure 10 is used in low cost disposable electronic applications such as credit cards or smart cards. Chip or substrate 11 is a semiconductor substrate such as silicon, silicon germanium, gallium arsenide, indium phosphide, or the like. Semiconductor circuit or device 23 is on first surface 13 of semiconductor chip 11. Semiconductor device 23 is fabricated on a semiconductor wafer which can be thinned to approximately 100 microns in order to improve thermal dissipation and to make flip-chip structure 10 more compact. After thinning, semiconductor wafer is diced into chips such as semiconductor chip 11. Device fabrication, wafer thinning, and wafer dicing processes are known to those who are skilled in the art of semiconductor manufacturing. Semiconductor device 23 can be a single device including a transistor, resistor, capacitor, or inductor. Semiconductor device 23 can also be an integrated circuit including a DRAM, SRAM, amplifier, or microcontroller.

Conductive bumps 16 are on first surface 13 of semiconductor chip 11 and are electrically connected to semiconductor device 23. Conductive bumps 16 are preferably wire bond bumps comprising a gold and palladium alloy approximately 35 microns in diameter and 60 microns high. Conductive bumps or wire bond bumps 16 are formed on first surface 13 of chip 11 using conventional wire bond bump processes as known in the art.

Substrate 12 is similar to a PC board of insulating material comprising glass cloth and epoxy approximately 50 microns thick. Conductive element 17 is on second side 18 of substrate 12 and comprises copper. Conductive element 17 is approximately 25 microns thick and shaped into a predefined pattern. Conductive material or metallic wiring pattern 17 electrically connects flip-chip structure 10 to a smart card reader or other device for biasing and data transfer.

Semiconductor device 23 on first surface 13 of chip 11 is connected to metallic wiring pattern 17 by wire bond bumps 16 which contact metallic wiring pattern 17 through vias 19 which are cut into insulating substrate 12. Vias 19 are formed in insulating substrate 12 using conventional etching processes for insulating substrates as known in the art. Vias 19 are formed by etching into first side 21 of substrate 12 before or after formation of metallic wiring pattern 17 on second side 18 of substrate 12. If via etching is performed after formation of metallic wiring pattern 17, the via etching through substrate 12 terminates upon reaching metallic wiring pattern 17 such that etching of vias 19 does not etch metallic wiring pattern 17. Approximately 500 microns in diameter, vias or through-holes 19 will be as high as the thickness of substrate 12 since vias 19 extend from first side 21 to second side 18 of substrate 12. Diameter of vias 19 are such that vias 19 are at least partially covered by metallic wiring pattern 17. Diameter of vias 19 is larger than diameter of conductive bumps 16 such that conductive bumps can be inserted into vias 19 from first side 21 of substrate 12.

After formation of semiconductor device 23 and conductive bumps 16 on chip 11 and after formation of conductive element 17 and vias 19 on substrate 12, the preferred embodiment of assembling flip-chip structure 10 includes depositing filler material 22 in vias 19, inserting conductive bumps 16 into predetermined vias 19 from first side 21 of substrate 12 to contact conductive element 17 on second side 18 of substrate 12, and curing filler material 22. Filler material 22 is a conductive epoxy which holds conductive bumps 16, and therefore chip 11, in place and also assists in the electrical coupling of conductive bumps 16 to conductive element 17. Quantities of filler material 22 are deposited in vias 19 such that filler material 22 does not overflow out of vias 19 after conductive bumps 16 are inserted into vias 19. Filler material or conductive epoxy 22 is less likely to short together adjacent conductive bumps 16 since conductive epoxy 22 is contained within vias 19. Conductive epoxy 22 does not leak out of second side 18 of substrate 12 due to conductive element 17 covering vias 19 on second side 18 of substrate 12 or due to capillary action.

Since epoxy curing involves much lower temperatures than thermal compression or eutectic bonding, mismatches in thermal expansion coefficients are less likely to cause misalignment of chip 11 relative to substrate 12. Conductive bumps 16 placed in vias 19 aid in maintaining proper registration and prevent large shifts of chip 11 relative to substrate 12. Conductive bumps 16 can support chip 11 above substrate 12 during curing of conductive epoxy 22. Additionally, since epoxy 22 is conductive, the assembly process does not require thermal compression or a reflow process to ensure that conductive bumps 16 properly adhere and provide electrical contact to conductive element 17.

In conventional flip-chip technologies, a set of conductive bumps can be manufactured on all components which are to be connected together. The assembly process of the present invention which uses vias 19 and conductive epoxy 22 is faster than the conventional flip-chip processes since it eliminates the need to fabricate a second set of conductive bumps on substrate 12. The alignment process of the present invention is also easier than that of conventional flip-chip technologies since inserting conductive bumps 16 into vias 19 containing conductive epoxy 22 is an easier process than that of aligning two sets of protruding flip-chip bumps.

After assembly of substrates 11 and 12 to form flip-chip structure 10, an underfill can be added to fill space between substrate 12 and chip 11. Capillary action distributes the underfill throughout the space between substrate 12 and chip 11. Alternatively, prior to connecting chip 11 to substrate 12, a non-conductive epoxy can be deposited on first side 21 of substrate 12 to adhere chip 11 to substrate 12. Depositing a non-conductive epoxy on first side 21 prevents shorting of neighboring conductive bumps 16 and eliminates the need for a subsequent underfill deposition.

With the use of conductive epoxy 22 in vias 19, conductive bumps 16 do not have to physically contact conductive element 17 which covers vias 19 on second side 18 of substrate 12. Conductive epoxy 22 can serve as an electrical connection between conductive bumps 16 and conductive material 22. In this situation, first surface 13 of chip 11 can rest on first side 21 of substrate 12.

Furthermore, instead of depositing conductive epoxy 22 into vias 19, a non-conductive epoxy can be deposited into and completely fill vias 19. Non-conductive epoxy 22 can also be deposited onto first side 21. In this manner, the subsequent underfill deposition is also not required to fill the space between substrates 11 and 12. Conductive epoxy or filler material 22 can also be a resin, solder, or other substance.

Regardless of the type of material deposited between chip 11 and substrate 12, the material is preferably one having similar thermal expansion coefficients as that of chip 11, conductive bumps 16, and substrate 12. The material between substrates 11 and 12 can also be used as a stress buffer for structure 10.

In addition to glass cloth and epoxy, substrate 12 can be composed of other insulators including polyester for a low cost embodiment and a polyimide for a more flexible embodiment. If polyimide is used, a conventionally known laser process, instead of an etching process, can be used to form vias 19 in polyimide substrate 12.

In addition to copper, conductive element 17 can be composed of other conductive materials including aluminum, gold, or a conductive polymer. Depending upon a desired application, conductive element 17 can form a complex metallic wiring pattern or a simple interconnect pad. Conventional flip-chip substrates require conductive element 17 extending from first side 21 around to second side 18 of substrate 12 since vias 19 are not used. The present invention reduces the cost of flip-chip packages by using vias 19 and eliminating the need for patterning conductive element 17 on first side 21 of substrate 12. Since conductive element 17 does not have to wrap around substrate 12 from first side 21 to second side 18, conductive element 17 of the present invention is not restricted to being as pliable as is required for conventional flip-chip packaging.

In addition to wire bond bumps, conductive bumps 16 can be electroplated bumps, solder bumps, conductive polymer bumps, or other flip-chip type bumps. Electroplated bumps can be made of gold with tin plating on conductive element 17 to form a gold/tin joint. A solder joint can be composed of solder paste in vias 19 and gold or a high temperature solder wire bump on chip 11. The high temperature solder wire bump can also be capped with a lower temperature solder on the distal end of conductive bump 16. Regardless of its shape or composition, conductive bumps 16 should fit in vias 19, can be higher than the depth of vias 19 or the height of substrate 12, and can support chip 11 above substrate 12 during assembly of structure 10. The use of conductive bumps 16 instead of conventional wire bonds reduces the distance a signal has to travel to reach semiconductor device 23. The reduced path improves the speed of flip-chip structure 10 which is especially important for microwave applications.

Similar to conductive bumps 16, a second set of conductive bumps can be fabricated in vias 19. The second set of conductive bumps are electrically connected to conductive element 17. The two sets of conductive bumps are structured such that during assembly of substrate structure 10, the two sets of conductive bumps are contained within via 19. In this manner, adjacent conductive bumps are not shorted together.

To improve heat dissipation, a heat sink can be attached to second surface 14 of chip 11. The heat sink is composed of materials and is shaped into forms known in the art.

It is to be understood that the present invention can be applied to multi-chip modules or MCMs. Multiple semiconductor chips can be connected to substrate 12 through additional or the same vias 19 to form flip-chip structure 10. It is also within the scope of the present invention to attach additional semiconductor chips or discrete devices to conductive element 17 without using vias 19. In this manner, the additional semiconductor chips or discrete devices face second side 18 of substrate 12 and connect directly to conductive element 17.

The present invention can also be applied to a connection of two insulating substrates or two PC boards. Substituting chip 11 with an additional substrate, conductive bumps 16 are connected to another metallic wiring pattern on additional substrate 11, are inserted into vias 19 from first side 21 of first substrate 12, and electrically couple to conductive element 17 on second side 18 of first substrate 11. Yet another embodiment includes substituting a discrete device such as a resistor, capacitor, or inductor for chip 11. Similarly, conductive bumps 16 are connected to discrete device 11 and are connected to conductive element 17 through vias 19. A further embodiment includes substituting a packaged semiconductor chip for unpackaged semiconductor chip 11. In this manner, packaged semiconductor chip 11 uses conductive bumps 16 to connect to conductive element 17 through vias 19.

Substrate 12 can also be substituted with an additional chip. Whether packaged or unpackaged, the stacking of semiconductor chips using the present invention will increase the overall packing density and reduce the volume of space required for the semiconductor chips.

Therefore, in accordance with the present invention, it is apparent there has been provided an improved structure and method of connecting substrates which overcomes the disadvantages of the prior art. The present invention eliminates thermal compression and the problems associated with such a process during assembly, provides containment for conductive epoxy which prohibits shorting of neighboring conductive bumps, eliminates the need for assembling a semiconductor chip to a leadframe and the excess packaging associated with the leadframe, and eliminates the need to fabricate a second set of conductive bumps on the substrate which is used in other flip-chip assemblies. As a result, the structure for and method of the present invention produces a product which is compact, fast, reliable, and inexpensive.

We claim:

1. An electronic component comprising: an electrically insulating substrate having a via extending from a first side of the electrically insulating substrate to a second side of the electrically insulating substrate; a conductive element covering a portion of the second side of the electrically insulating substrate and covering at least part of the via over the second side of the electrically insulating substrate wherein the conductive element is comprised of copper and wherein the conductive element non-planar with the second side of the electrically insulating substrate; another substrate containing a conductive bump located in the via and electrically coupled to the conductive element; and a filler material in the via wherein the electronic component is devoid of a leadframe.

2. The electronic component of claim 1 wherein the electrically insulating substrate comprises glass cloth and epoxy.

3. The electronic component of claim 1 wherein the electrically insulating substrate comprises polyimide.

4. The electronic component of claim 1 wherein the filler material is electrically conductive.

5. The electronic component of claim 1 wherein the conductive element is non-planar with the second side of the insulating substrate.

6. The electronic component of claim 1 further comprising a single conductive bump in the via wherein the conductive bump is the single conductive bump.

7. The electronic component of claim 1 wherein the another substrate is selected from the group consisting of an insulating substrate, a packaged semiconductor chip, an unpackaged semiconductor chip, and a discrete device.

8. The electronic component of claim 1 wherein the filler material is selected from the group consisting of a conductive epoxy, a non-conductive epoxy, a resin, and a solder.

9. The electronic component of claim 1 wherein the conductive bump comprises a wire bond bump.

10. A flip-chip structure comprising: an insulating substrate having a via extending from a first side of the insulating substrate to a second side of the insulating substrate; a conductive element covering a portion of the second side of the insulating substrate and covering at least part of the via on the second side of the insulating substrate wherein the conductive element is comprised of copper and wherein the conductive element is non-planar with the second side of the insulating substrate; a first surface of a semiconductor chip facing the first side of the insulating substrate; a semiconductor device adjacent to the first surface of the semiconductor chip; a wire bond bump on the first surface of the semiconductor chip electrically coupling the semiconductor device through the via on the first side of the insulating substrate to the conductive element; and a conductive epoxy in the via wherein the flip-chip structure is devoid of a leadframe.

11. The flip-chip structure of claim 10 wherein the insulating substrate comprises polyimide.

12. The flip-chip structure of claim 10 wherein the insulating substrate comprises glass cloth and epoxy.

13. The electronic component of claim 10 further comprising a single conductive bump in the via wherein the wire bond bump is the single conductive bump.

* * * * *